United States Patent [19]
Masuda et al.

[11] Patent Number: 5,701,267
[45] Date of Patent: Dec. 23, 1997

[54] SEMICONDUCTOR STORAGE DEVICE WITH MACRO-CELL WITH MONITORING OF INPUT DATA

[75] Inventors: Shinichi Masuda; Satoshi Kumaki; Yoshinori Matsuura, all of Tokyo, Japan

[73] Assignees: Mitsubishi Electric Engineering Co., Ltd.; Mitsubishi Denki Kabushiki Kaisha, both of Tokyo, Japan

[21] Appl. No.: 578,892

[22] Filed: Dec. 27, 1995

[30] Foreign Application Priority Data

Aug. 18, 1995 [JP] Japan .................. 7-210608

[51] Int. Cl.$^6$ .................. G11C 13/00
[52] U.S. Cl. .............. 365/201; 365/189.04; 365/189.11
[58] Field of Search ............... 365/201, 189.04, 365/189.11

[56] References Cited

U.S. PATENT DOCUMENTS

| | | | |
|---|---|---|---|
| 5,040,150 | 8/1991 | Naitoh et al. | 365/189.04 |
| 5,208,782 | 5/1993 | Sakuta et al. | 365/51 |
| 5,255,239 | 10/1993 | Taborn et al. | 365/201 |
| 5,502,677 | 3/1996 | Takahashi | 365/189.04 |
| 5,502,683 | 3/1996 | Marchioro | 365/189.04 |
| 5,541,886 | 7/1996 | Hasbun | 365/189.04 |

OTHER PUBLICATIONS

IEEE 1992 Custom Integrated Circuits Conference, pp. 7.4.1–7.4.4, 1992, Masatoshi Kimura, et al., "A 3V 100MHz, 35mW, Dynamic Line Memory Macro Cell for HDTV Applications".

*Primary Examiner*—David C. Nelms
*Assistant Examiner*—Michael T. Tran
*Attorney, Agent, or Firm*—Oblon, Spivak, McClelland, Maier & Neustadt, P.C.

[57] ABSTRACT

It is an object of the present invention to realize bypass of input data in a macro-cell such as a FIFO memory etc. to facilitate test and evaluation about other macro-cells. A bypass route (6) is provided between an input port (DI) and an output port (DO) in a FIFO memory (1) and a data bypassing selector (8) is further provided for selecting the bypass route (6) and a sense amplifier (7) of a read bit line (R.BL). Then, in the test mode, a first selector control signal (S) is set to an L level and a second selector control signal ($\overline{S}$) of opposite phase is set to an H level. Thus, in the test mode, a data inputted from the input port (DI) is outputted from the output port (DO) by way of the bypass route (6) without via memory cells (MC1–MCX).

17 Claims, 9 Drawing Sheets

SEMICONDUCTOR STORAGE DEVICE WITH MACRO-CELL WITH MONITORING OF INPUT DATA

BACKGROUND OF THE INVENTION

1. Field of the Invention

The present invention relates to a semiconductor storage device and a macro-cell thereof for enabling monitoring of input data.

2. Description of the Background Art

FIG. 11 is a diagram showing the structure of a conventional FIFO memory 1P using three-transistor type dual port dynamic memory cells. The device 1P includes three-transistor type memory cells MC capable of independent writing and reading, a write driver WD for writing data, a write pointer WP for receiving an activate signal WS and for sequentially outputting clocks for each write word line to cause that word line to rise, a read pointer RP for receiving an activate signal RS and for sequentially outputting clocks for each read word line to cause that read word line to rise, a precharge transistor PCT for always pulling up a read bit line RB at an "H" level, a sense amplifier SA for amplifying a potential on the read bit line RB, an input port DIP and an output port DOP.

The write pointer WP outputs each clock in response to the activation by the activate signal WS to perform an operation of sequentially raising each of the write word lines WL1–WLX with the each clock.

In the same way, the read pointer RP, which is formed of a shift register, for example, outputs each clock in response to the activation by the activate signal RS to perform an operation of sequentially raising each of the read word lines RL1–RLX with the each clock.

As described above, the conventional FIFO memory adopts the structure and operation in which the pointer activate signals WS and RS are inputted and an input data is once written into the memory cells MC and then read out. Accordingly, if a fault exists in the memory cells or the like, the value of data outputted from the output port DOP will be uncertain.

Hence, for the purpose of testing and evaluating quality of other macro-cells (logic circuits, etc.) connected to the output port of the FIFO memory in the semiconductor integrated circuit, a bypass route 43 and a selector 41 for selecting the output of the FIFO memory 1P and the output of the bypass route 43 are provided outside of the FIFO memory 1P in the same chip, as shown in FIG. 12. (Refer to Japanese Patent Laying-Open No. 4-287942, for example) In FIG. 12, the reference numerals 40 and 42 indicate a test clock generator and an adding circuit as another macro-cell, respectively.

In the structure in which a test circuit is provided out of the FIFO memory, however, the FIFO memory and the portion around it require a large area in layout, which is a problem in reducing the area. Furthermore, preparation for performing the evaluation test is complicated and a long time is required for the preparation.

Such problems are not limited to the FIFO memory, but also arise when using a random access memory as a macro-cell, which can be general problems in the semiconductor storage devices.

SUMMARY OF THE INVENTION

A first aspect of the present invention is directed to a semiconductor storage device comprising a macro-cell provided inside of a semiconductor integrated circuit. According to the present invention, the macro-cell comprises an input port, a memory cell capable of independently performing writing of a data inputted from the input port and reading of the data, an output port for outputting the data read from the memory cell in a normal operation, and bypass means for connecting the input port to the output port without through the memory cell to transmit the data inputted from the input port intactly to the output port in a test mode.

Preferably, according to the semiconductor storage device, the macro-cell further comprises a write bit line for transmitting the data inputted from the input port to an input end of the memory cell, and a read bit line for transmitting the data read from an output end of the memory cell to the output port, and the bypass means directly connects the write bit line and the read bit line in the test mode, and the memory cell is controlled not to perform reading of the data in the test mode.

Preferably, according to the semiconductor storage device, the macro-cell further comprises a driver connected to the input port, a sense amplifier, a write word line for transmitting a write address signal to the memory cell, a read word line for transmitting a read address signal to the memory cell, and a precharge transistor having one of its semiconductor regions connected to a power-supply potential, the write bit line being connected to an output end of the driver and the input end of the memory cell, the read bit line being connected to the other semiconductor region of the precharge transistor, the output end of the memory cell and an input end of the sense amplifier, and the bypass means comprises a bypass route having its one end and the other end connected to the output end of the driver and the input end of the sense amplifier, respectively, the bypass route comprising a selector for connecting the output end of the driver to the input end of the sense amplifier only in the test mode, wherein the read address signal is supplied as an address signal at a level at which the read word line will not rise and the precharge transistor is controlled to an OFF state in the test mode.

A second aspect of the present invention is directed to a semiconductor storage device comprising a macro-cell provided inside of a semiconductor integrated circuit. According to the present invention, the macro-cell comprises an input port, a plurality of memory cells which are capable of independently performing writing of data inputted from the input port and reading of the data, and an output port for outputting the data read from each of the plurality of memory cells, wherein an arbitrary one of the plurality of memory cells is controlled to be able to simultaneously perform writing and reading of the data and others are all controlled not to be able to read the data in a test mode.

A third aspect of the present invention is directed to a semiconductor storage device comprising a macro-cell provided inside of a semiconductor integrated circuit. According to the present invention, the macro-cell comprises an input port, a plurality of memory cells each having a write word line and a read word line and capable of independently writing data inputted from the input port and reading the data, an output port for outputting the data read from each of the plurality of memory cells, and control means for causing the write word lines and the read word lines of all of the plurality of memory cells to simultaneously rise in a test mode.

The present invention has been made to solve such problems as described hereinbefore, and main objects of the present invention are (1) to reduce a layout area at the chip level, (2) to simplify test and evaluation of macro-cells, (3) to reduce power consumption at the chip level, and (4) to improve a delay time of an input data to thereby improve the electric characteristics.

These and other objects, features, aspects and advantages of the present invention will become more apparent from the following detailed description of the present invention when taken in conjunction with the accompanying drawings.

DESCRIPTION OF THE PREFERRED EMBODIMENTS

In the preferred embodiments of the present invention, structures based on generically divided two technical ideas are created to remove the requirement of providing a test circuit outside of a macro-cell forming a semiconductor storage device. In the first structure, an input data is outputted directly from an output port and not via memory cells. In the second structure, the input data is outputted from the output port via a memory cell or memory cells. Details of the preferred embodiments based on the present invention will now be described.

(First Preferred Embodiment)

A FIFO (First IN First Out) memory or a sequential access memory (SAM) will now be described as an example of a semiconductor storage device provided in a 1-chip semiconductor integrated circuit as one of macro-cells. The macro-cell means each individual function block on one chip, such as an adder, a memory, etc.

Figure 1:
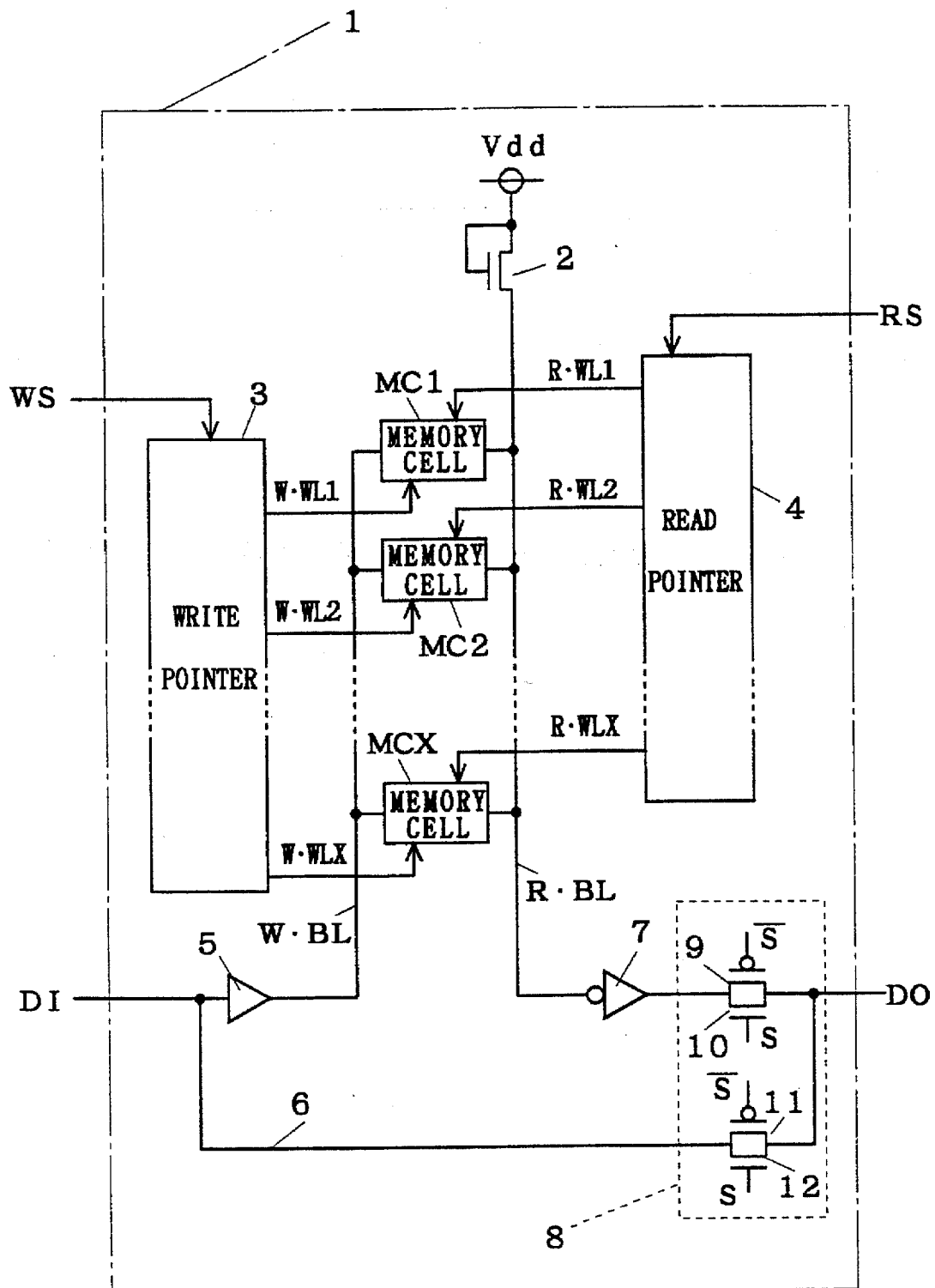
FIG. 1 is a diagram showing an example of a first preferred embodiment of the present invention.

A preferred embodiment of a FIFO memory 1 is shown in FIG. 1.

In FIG. 1, reference numerals and characters indicate parts as follows. That is, 1 denotes a FIFO memory as a macro-cell, 2 denotes an n-channel precharge transistor having its gate electrode connected to a power-supply Vdd together with its drain region and its source region connected to one end of a read bit line R.BL, 3 denotes a write pointer formed of a shift register and the like, 4 denotes a read pointer formed of a shift register and the like, 5 denotes a write driver for amplifying an input data, 6 denotes a bypass route, 7 denotes a sense amplifier with an inverting function for amplifying a potential on the read bit line R.BL, 8 denotes a data bypassing selector formed of p-channel MOS transistors 9 and 11 and n-channel MOS transistors 10 and 12, MC1, MC2, . . . MCX all denote memory cells, W.WL1, W.WL2, . . . W.WLX all denote write word lines, R.WL1, R.WL2, . . . R.WLX all denote read word lines, W.BL denotes a write bit line, WS denotes an activate signal for the write pointer 3, RS denotes an activate signal for the read pointer 4, S denotes a positive-phase first selector control signal, $\overline{S}$ denotes a negative-phase second selector control signal, DI denotes an input port for inputting data into the FIFO memory 1, and DO denotes an output port for outputting data read from the memory cells, respectively. The two ports DI and DO are disposed relatively adjacent in layout. The above-stated bypass route 6 is provided between the two ports DI, DO through the complementary transistors 11 and 12 in the data bypassing selector 8.

The write pointer 3 sequentially causes the write word lines W.WL1W–W.WLX to rise every time it sequentially outputs a clock as a write address signal. The read pointer 4 also sequentially causes the read word lines R.WL1–W.RLX to rise every time it sequentially outputs a clock as a read address signal.

The precharge transistor 2 always pulls up the read bit line R.BL to an "H" level.

For convenience, in the description below, respective memory cells MC1, . . . , MCX are generically called "memory cell MC", and the write word lines W.WL1, . . . W.WLX and the read word lines R.WL1, . . . R.WLX are also generically called "write word line W.WL" and "read word line R.WL", respectively.

Figure 2:
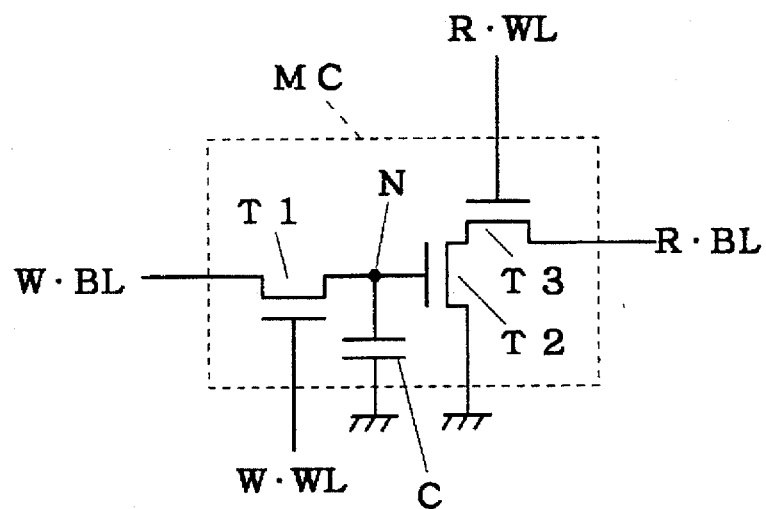
FIG. 2 is a diagram sowing the structure of a memory cell as a three-transistor type dual port dynamic cell.

The memory cell MC in this device is a three-transistor type dual port dynamic memory cell which can independently perform writing of data inputted from the input port DI and reading of the data. An example of a structure of this memory cell MC is shown in FIG. 2. As shown in FIG. 2, the memory cell MC includes three transistors all formed of n-channel MOS transistors, i.e., a write transistor T1, a read path transistor T2 and a read access transistor T3 and a storage capacitance C dynamically holding charge. In FIG. 2, the reference character N denotes a storage node.

This preferred embodiment is characterized in that the data bypassing selector 8 is provided at the position just before the output port DO, which selector 8 having one of its input ends directly connected to the input port DI through the bypass route 6 and the other one of its input ends connected to an output end of the sense amplifier 7, wherein the data read from the memory cell MC and the input data are selected by the first and second selector control signals S and $\overline{S}$ for controlling the selector 8.

Now, the operations of the FIFO memory 1 will be described in a normal operation and in a test mode.

First, in the case of the normal memory operation, the first selector control signal S is set to an "H" level and the second selector control signal $\overline{S}$ is set to an "L" level, respectively. Then, the transistors 9 and 10 turn on and the transistors 11 and 12 turn off and then the data bypassing selector 8 connects the output end of the sense amplifier 7 to the output port DO.

Figure 3:
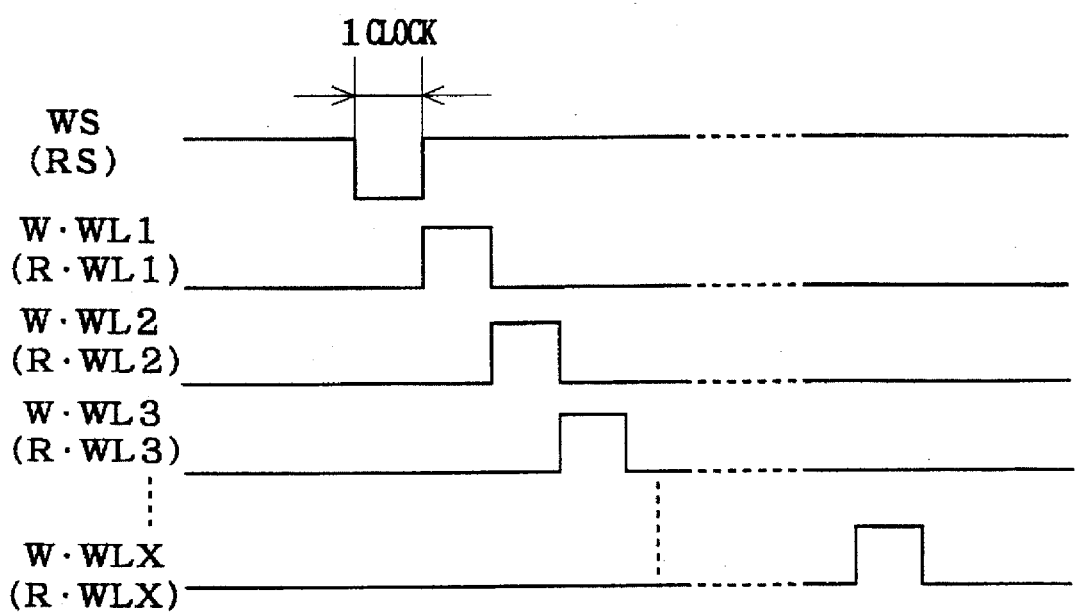
FIG. 3 is a diagram showing the operation of a write pointer and a read pointer.
Figure 4:
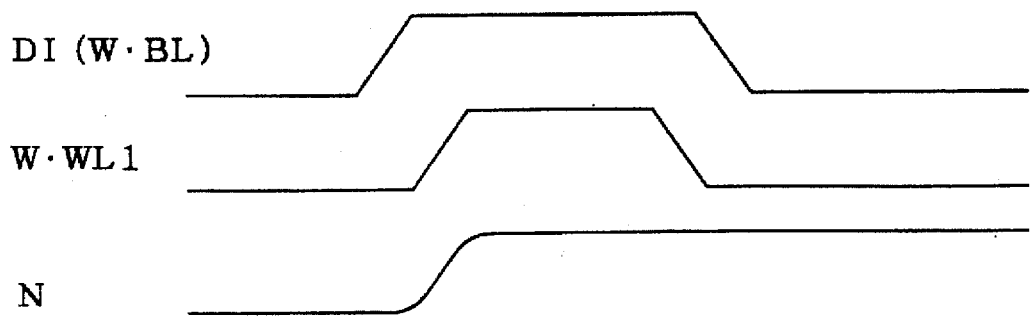
FIG. 4 is a diagram showing the writing operation of data into the memory cell.
Figure 5:
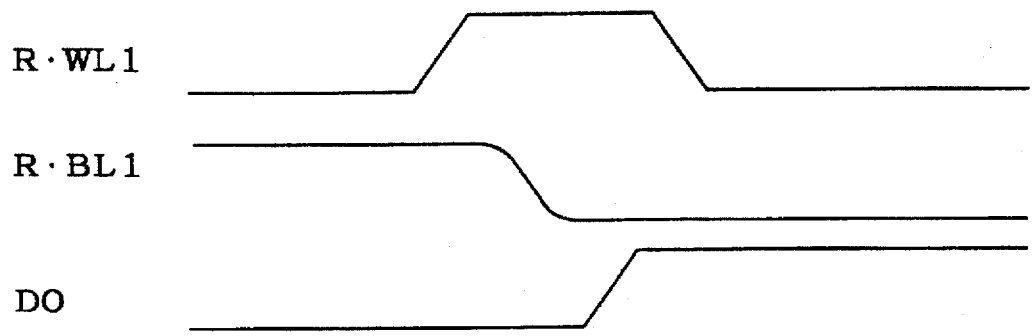
FIG. 5 is a diagram showing the reading operation of data from the memory cell.

Next, as shown in FIG. 3, FIG. 4 and FIG. 5, data writing into and reading from the memory cell MC are performed. FIG. 3 is a timing chart showing the operation of the write pointer 3 (the read pointer 4).

FIG. 4 shows an example of writing a data at an "H" level when the initial hold potential of the memory cell MC is at an "L" level. The data at an "H" level inputted to the input port DI is driven by the write driver 5, and as a result, the write bit line W.BL attains an "H" level. Next, the write pointer 3 supplies the write word line W.WL (which corresponds to the write word line W.WL1 in the case of FIG. 4) with a write address signal (refer to FIG. 3) to cause that write word line W.WL to rise and thus the write transistor T1 in the memory cell MC of FIG. 2 is activated, and as a result, charge at an "H" level is held in the storage capacitance C connected to the storage node N.

FIG. 5 shows the sequence in the case of reading the potential at an "H" level held in the memory cell MC. Before reading, the read bit line R.BL is previously pulled up to an "H" level by the precharge transistor 2. At this time, the read pointer 4 supplies the read word line R.WL (which corresponds to the read word line R.WL1 in the case of FIG. 5) with a read address signal (refer to FIG. 3) to cause the read word line R.WL to rise. Thus, the read path transistor T2 and the read access transistor T3 in the memory cell MC in FIG. 2 are activated. This operation forces the pulled up potential on the read bit line R.BL to an "L" level. Then, the potential at the "L" level is amplified by the sense amplifier 7 having an inverting function, and the data at an "H" level is outputted from the output port DO through the transistors 9 and 10.

Next, in the test mode, the first selector control signal S is set to an "L" level and the second selector control signal $\overline{S}$ is set to an "H" level, respectively, irrespective of the writing operation and the reading operation of the memory cells. This turns off the transistors 9 and 10 and turns on the transistors 11 and 12 and then the data bypassing selector 8 connects the other end of the bypass route 6 to the output port DO to bypass the data signal inputted from the input port DI intactly to the output port DO.

The configuration of the data bypassing selector 8 is arbitrary. Although the selector 8 is formed with the complementary transistors (9, 10), (11, 12) in the example of FIG. 1, it may alternatively have a mono-channel type structure. Since the complementary type structure is superior to the mono-channel type in stability, however, the complementary type structure will better fulfil the requirement for sufficient amplitude for meeting the recent tendency toward voltage reduction.

As has been described above, in this preferred embodiment, the bypass route 6 and the data bypassing selector 8 form "bypass means", which interrupts output of data read from the memory cell MC only in the test mode and connects the input port directly to the output port.

Figure 6:
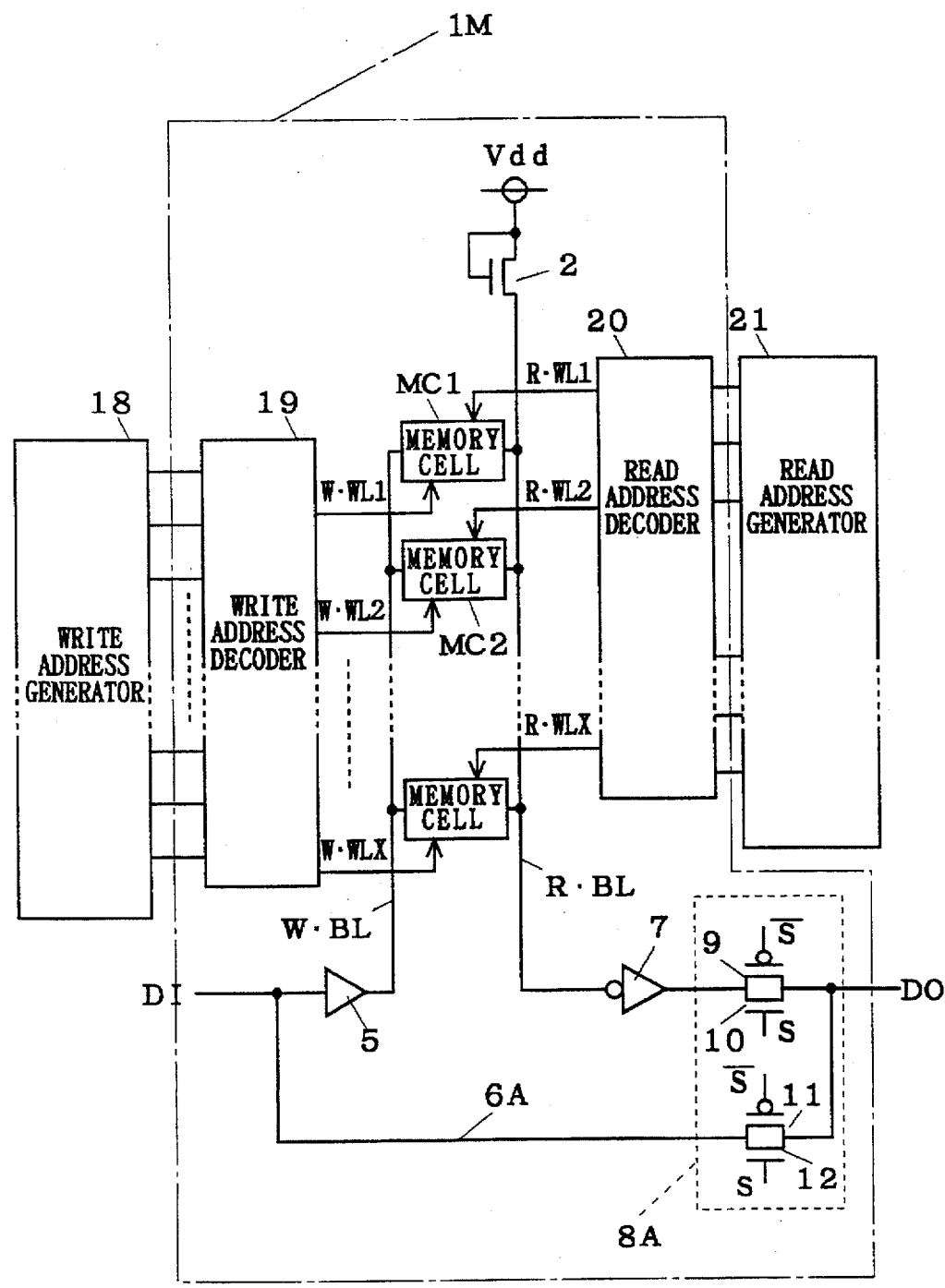
FIG. 6 is a diagram showing another example of the first preferred embodiment of the present invention.

In this preferred embodiment, a FIFO memory (SAM or a line memory) is shown as a structure of a semiconductor storage device, but the bypass means can also be applied to a random access memory (RAM) instead. An example thereof is shown in FIG. 6. In FIG. 6, the character 6A corresponds to the bypass route 6 and 8A corresponds to the data bypassing selector 8.

Further, although the memory cell MC is described as of the dynamic type, the bypass means can be applied even if the memory cell is of the static type instead.

As has been described above, according to this preferred embodiment, since the bypass means can be realized in the macro-cell, it is more advantageous than the conventional technique in layout and the area penalty is improved, resulting in area reduction in layout at the chip level.

Especially, in the layout designing, as the input port DI and the output port DO are disposed relatively adjacent to each other, and the bypass route is provided between the adjacent two ports DI and DO, the bypass route length can be reduced in structure, which has the advantage of minimizing a delay time attendant on the existence of the bypass route. Accordingly, the delay time of the input data can be improved as compared with the conventional technique, and the electric characteristics can also be improved.

Furthermore, it also has the advantage in that the evaluating work in the test mode is facilitated, because the control needs only the first and second selector control signals S and $\overline{S}$.

(Second Preferred Embodiment)

Figure 7:
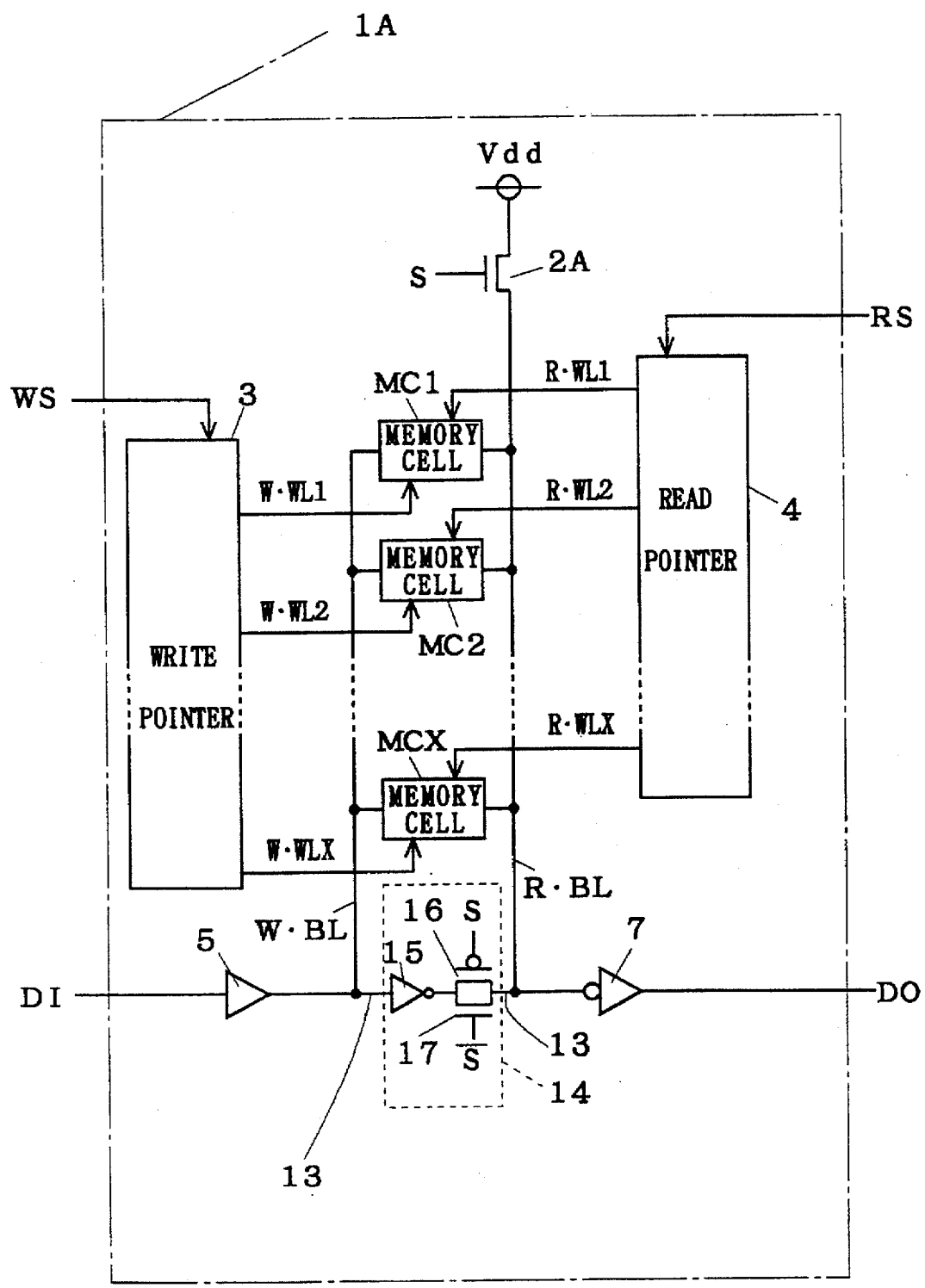
FIG. 7 is a diagram showing an example of a second preferred embodiment of the present invention.

FIG. 7 shows an example of structure of a FIFO memory 1A in this preferred embodiment.

In FIG. 7, except a bypass route 13, a bit line coupling selector 14, a precharge transistor 2A, and a method of controlling the memory cell MC and the precharge transistor 2A in the test mode, other components are the same as those shown in FIG. 1. The operations of the write pointer 3 and the read pointer 4 and the sequences of writing and reading in the normal operation mode are also the same as the operations and the sequences shown in FIG. 3 through FIG. 5.

In this preferred embodiment, the bypass route 13 including the bit line coupling selector 14 is provided between the write bit line W.BL and the read bit line R.BL to realize a bypass of data inputted from the input port DI. That is to say, the bypass route 13 has its one end and the other end connected to the output end of the word driver 5 and the input end of the sense amplifier 7 and the bit line coupling selector 14 is provided in the middle of the bypass route 13. The selector 14 includes an inverter 15 and complementary MOS transistors (16, 17). The inverter 15 is provided in the bit line coupling selector 14 because the reading is of the negative logic. Inputted to a gate electrode of one p-channel MOS transistor 16 is the positive-phase first selector control signal S, and inputted to a gate electrode of the other n-channel MOS transistor 17 is the negative-phase second selector control signal $\overline{S}$.

The drain region of the precharge transistor 2A is set to the power-supply potential Vdd, and its source region is connected to one end of the read bit line R.BL as an output end, and its gate electrode is supplied with the first selector control signal S.

In this preferred embodiment, in the test mode, the first selector control signal S is controlled to an "L" level and the second selector control signal $\overline{S}$ is controlled to an "H" level, respectively, so that the potential on the write bit line W.BL is bypassed to the read bit line R.BL as it is.

At this time, to avoid collision of the pull-up signal and the input data, the gate of the precharge transistor 2A for pulling up the read bit line R.BL is controlled by the first selector control signal S at the "L" level to put the precharge transistor 2A in an OFF state. In this case, although the precharge potential is held by a stray capacitance loaded on the read bit line R.BL, the two transistors 16 and 17 are set so that the potential of the bit line coupling selector 14 is higher than this precharge potential, and therefore the collision with the precharge potential does not occur.

When the data is bypassed, i.e., in the test mode, it must be controlled so that the data written in the memory cell MC is not outputted onto the read bit line R.BL. Accordingly, in the test mode, the activate signal RS is not inputted so that the read pointer 4 on the reading side will not be activated. This realizes a state equivalent to the state in which each read word line R.WL is supplied with an address signal at a level which will not cause that word line to rise as a read address signal, and then any data is not read from each memory cell MC.

When performing the normal memory operation, the first selector control signal S is set to an "H" level and the second selector control signal $\bar{S}$ is set to an "L" level, respectively.

The bit line coupling selector 14 can have an arbitrary structure, and although the selector 14 in FIG. 7 is configured using the complementary transistors, it is possible to form it as of the mono-channel type.

As stated above, in this preferred embodiment, the bypass route 13 including the selector 14 functions as "bypass means" in the test mode for connecting the input port to the output port without connection through the memory cell MC so that the input data is intactly transmitted to the output port. Particularly in this case, the bypass route 13 directly connects the write bit line W.BL and the read bit line R.BL in the test mode to realize this function.

Figure 8:
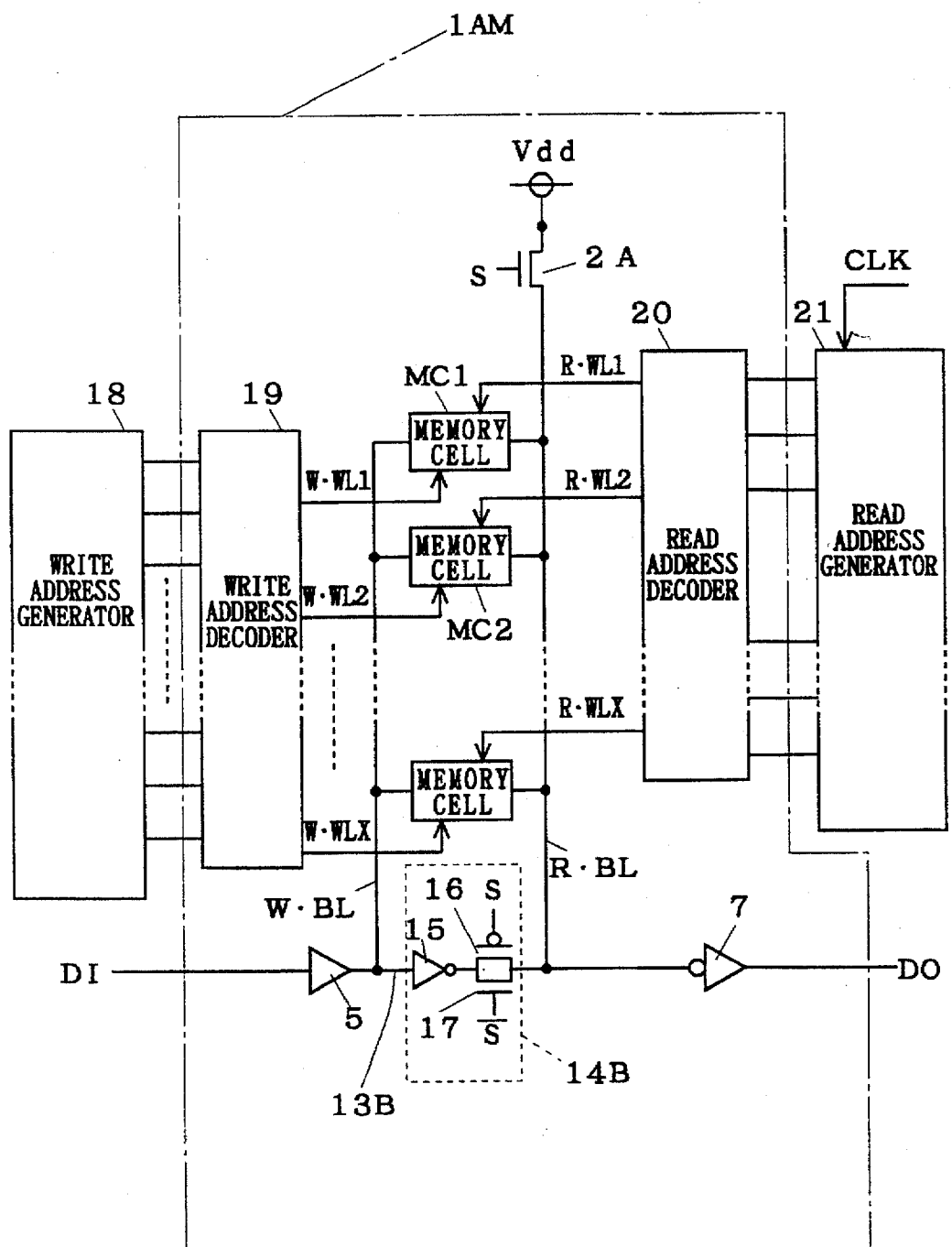
FIG. 8 is a diagram showing another example of the second preferred embodiment of the present invention.

In this preferred embodiment, although the semiconductor storage device is formed of the FIFO memory 1A, it is possible to apply the technical idea described above to the random access memory 1AM as shown in FIG. 8. In FIG. 8, in the test mode, a clock CLK is supplied to a read address generator 21 so that a read address decoder 20 supplies each read word line R.WL with an address signal at a level which will not cause that read word line to rise as a read address signal. Thus, in the test mode, any data is not read from each memory cell MC. The characters 13B and 14B correspond to the characters 13 and 14 in FIG. 7, respectively.

Further, although the description has been made on an example in which the memory cell MC is formed as the dynamic type, it goes without saying that the technical idea discussed in this preferred embodiment can be applied to the case in which each memory cell MC is formed as the static type.

As has been described above, in this preferred embodiment, bypassing the input data is realized in the macro-cell with only the write mode of the memory cell MC being activated and the read mode of the memory cell MC being controlled to be inactive in the test mode. This state can also be regarded as a state in which the FIFO memory 1A is not activated. Hence, according to this preferred embodiment, it is possible to test and evaluate other macro-cells while writing data into the memory cell MC at the same time.

It is a matter of course that this preferred embodiment in which the controlling processing with the first and second selector control signals S and $\bar{S}$ allows the input data to be outputted directly from the output port also has the effect of facilitating the test and evaluation.

Furthermore, as the bypass means is realized in the macro cell, area reduction in layout can be realized at the chip level similarly to the first preferred embodiment.

Particularly in this preferred embodiment, since the write bit line W.BL on the input port DI side and the read bit line R.BL on the output port DO side are disposed adjacent in packaging and the bypass route 13 can be disposed to short the adjacent two bit lines, the length of the bypass route can be further shorter than that in the first preferred embodiment, so that it can be said that this preferred embodiment is more advantageous than the first preferred embodiment in layout. Accordingly, the area penalty is further improved. This means that a delay time attendant on the bypass route is further reduced and this preferred embodiment will be more advantageous than the first preferred embodiment also in respect of improvement of electrical characteristics.

As has been described before, as data reading from each memory cell MC is not performed in the test mode, it will be more advantageous also in this point than the first preferred embodiment in which both data writing into and data reading from each memory cell are performed in the test mode. That is to say, in this second preferred embodiment, power consumption can be reduced at the chip level.

(Third Preferred Embodiment)

In this preferred embodiment, a bypass route is not newly provided in a macro-cell, but the structure is adopted in which only one arbitrary memory cell in a plurality of memory cells raises and activates its write word line and read word line at the same time to form a bypass route by itself and the macro-cell of a semiconductor storage device realizes a testing function by itself. In this preferred embodiment, an example of structure is shown in FIG. 9 which is applied to a FIFO memory 1B.

Figure 9:
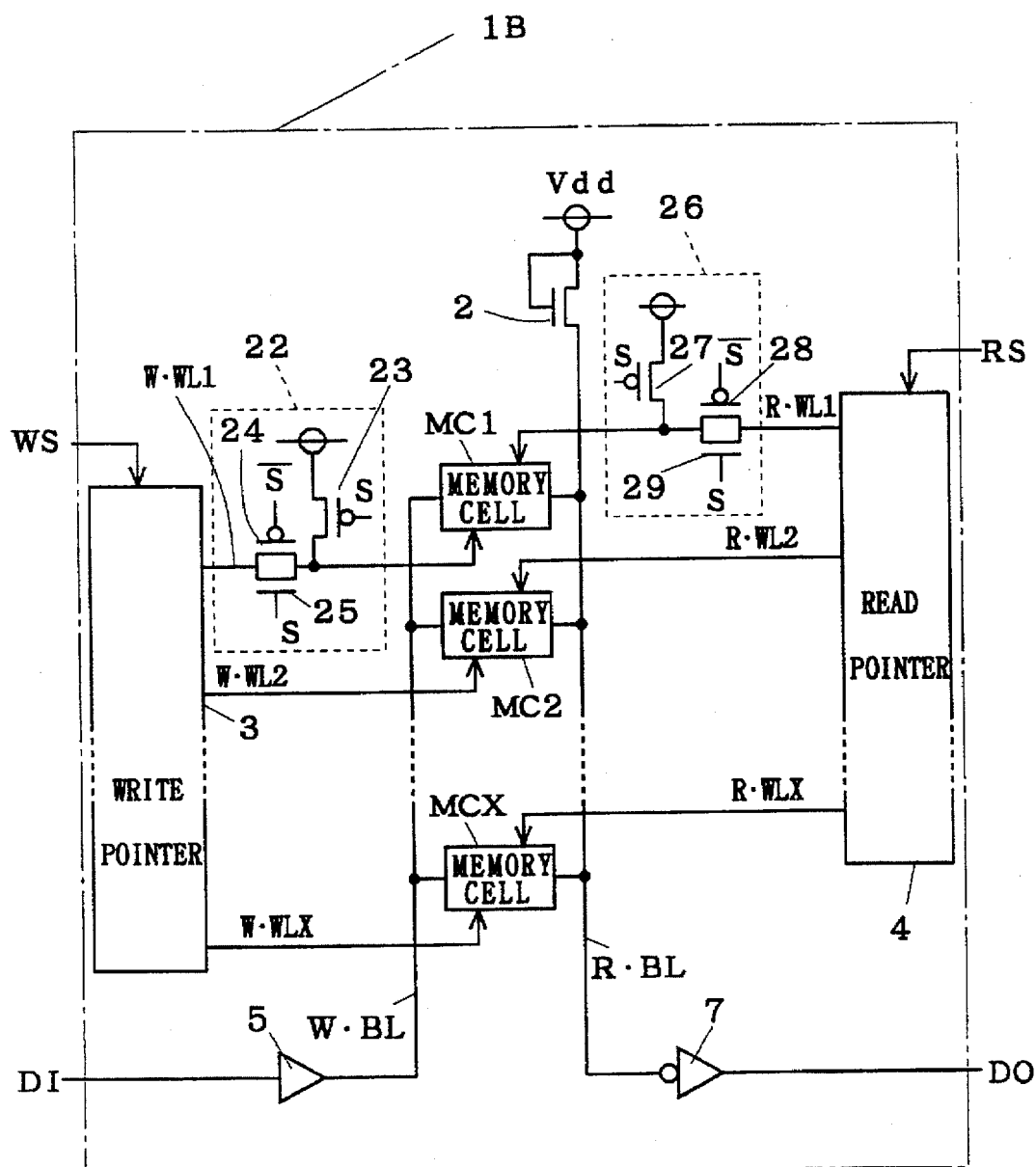
FIG. 9 is a diagram showing an example of a third preferred embodiment of the present invention.

In FIG. 9, except that word line raising selectors 22 and 26 are provided for setting both of the write word line W.WL and the read word line R.WL of an arbitrary one memory cell MC (which corresponds to the memory cell MC1, here) to a rising level, i.e., to an "H" level in the test mode, other components are all the same as corresponding ones in FIG. 1, and operations of the write pointer 3 and the read pointer 4 and each sequence of writing and reading are also the same as the operations and sequences shown in FIG. 3 to FIG. 5.

In this preferred embodiment in which the write word line and the read word line of the arbitrary one memory cell are provided with the selectors 22 and 26, and no selectors 22 and 26 provided to other memory cells, all of the three transistors in the arbitrary one memory cell MC (refer to FIG. 2) are activated at the same time and an input data is bypassed via the arbitrary one memory cell.

The write word line raising selector 22 includes complementary two MOS transistors 24 (p-channel) and 25 (n-channel) and a p-channel MOS transistor 23 having its source region connected to the power-supply potential Vdd and its drain region connected to the write word line W.WL1. The first, second and first selector control signals S, $\bar{S}$, S are applied to the gates of the transistors 23–25, respectively.

The read word line raising selector 26 has three MOS transistors 27 to 29 respectively corresponding to the MOS transistors 23 to 25.

In this preferred embodiment, when performing the normal memory operation, the first selector control signal S is set to an "H" level and the second selector control signal $\bar{S}$ is set to an "L" level, respectively, and in the test mode, the first selector control signal S is set to an "L" level and the second selector control signal $\bar{S}$ is set to an "H" level, respectively. Thus, the write word line raising selector 22 supplies the write address signal to the write word line W.WL1 and the memory cell MC1 in the normal operation, and it stops supply of the write address signal and applies an "H" level signal capable of raising to the write word line W.WL1 in the test mode. The read word line raising selector 26 functions in the same way.

Accordingly, in the test mode, the three transistors of an arbitrary memory cell MC, i.e., of the memory cell MC1 (refer to FIG. 2) are all activated, and that memory cell MC1 simultaneously performs writing and reading data. At this time, the activate signal RS for reading is not inputted to the read pointer 4 in the test mode to control not to read data in other memory cells MC2–MCX. As a result, a state is realized which is equivalent to a state in which a read address signal at a level incapable of raising is supplied to the read word lines R.WL2–R.WLX, and other memory cells MC2–MCX perform data writing but can not perform data reading in the test mode, and these memory cells MC2–MCX never create by themselves a bypass route for input data. As a result, the data inputted from the input port DI is outputted from the output port DO by way of the bypass route formed of the write bit line W.BL, the memory cell MC1 and the read bit line R.BL in the test mode. Other memory cells MC2–MCX only write the data.

The structure of the selectors 22 and 26 above is arbitrary, and the selectors 22 and 26 may be formed by using the complementary transistors (24, 25) and (28 and 29), as shown in FIG. 9, or it is also possible to form the selectors 22 and 26 by using the transistors (24, 25) and (28, 29) formed of the mono-channel type.

Also, in the example of FIG. 9, the structure of the semiconductor storage device is formed of the FIFO memory 1B, but the technical idea of this preferred embodiment can be applied to a random access memory, too. In this case, ones corresponding to the selectors 22 and 26 will be provided between a write address decoder and an arbitrary memory cell and between the arbitrary memory cell and a read address decoder.

Furthermore, although the example has been described in which the memory cell is formed as the dynamic type, the present invention can also be applied to the case where it is formed as the static type.

As has been described above, according to the third preferred embodiment, only one arbitrary memory cell is activated and other memory cells are all deactivated (but the write mode only is activated) to realize the bypass action of input data in the macro-cell, which provides easy test and evaluation, area reduction in layout at the chip level, and improvement of a delay time of input data, in the same way as the first and second preferred embodiments.

In the same way as the second preferred embodiment, the input data can be bypassed while performing data writing and memory cells other than the arbitrary memory cell do not perform data reading, which will result in decreased power consumption.

Especially, according to the third preferred embodiment, as there is no need of newly providing a bypass route unlike the first and second preferred embodiments already described, no unnecessary capacitance component is newly produced on the write bit lines and read bit lines. Hence, in the normal operation, good electric characteristics with a shorter delay time are obtained.

Providing the bypass route between the write bit line and the read bit line as in the second preferred embodiment has the demerit that the capacitance occurring in this portion is liable to consume more electricity, but this preferred embodiment has no such bypass route, causing no such unnecessary power consumption, which contributes more to reduction of power consumption.

(Fourth Preferred Embodiment)

This preferred embodiment adopts the structure in which no bypass route itself is provided in a macro-cell, and write word lines and read word lines are simultaneously caused to rise to perform data writing and data reading at the same time about all the memory cells in the macro-cell in the test mode to cause the macro-cell itself, such as a FIFO memory etc., to operate as a data bypass. Accordingly, the macro-cell such as a FIFO memory etc. performs the same operation as the normal operation in the test mode as well as in the normal operation mode.

Figure 10:
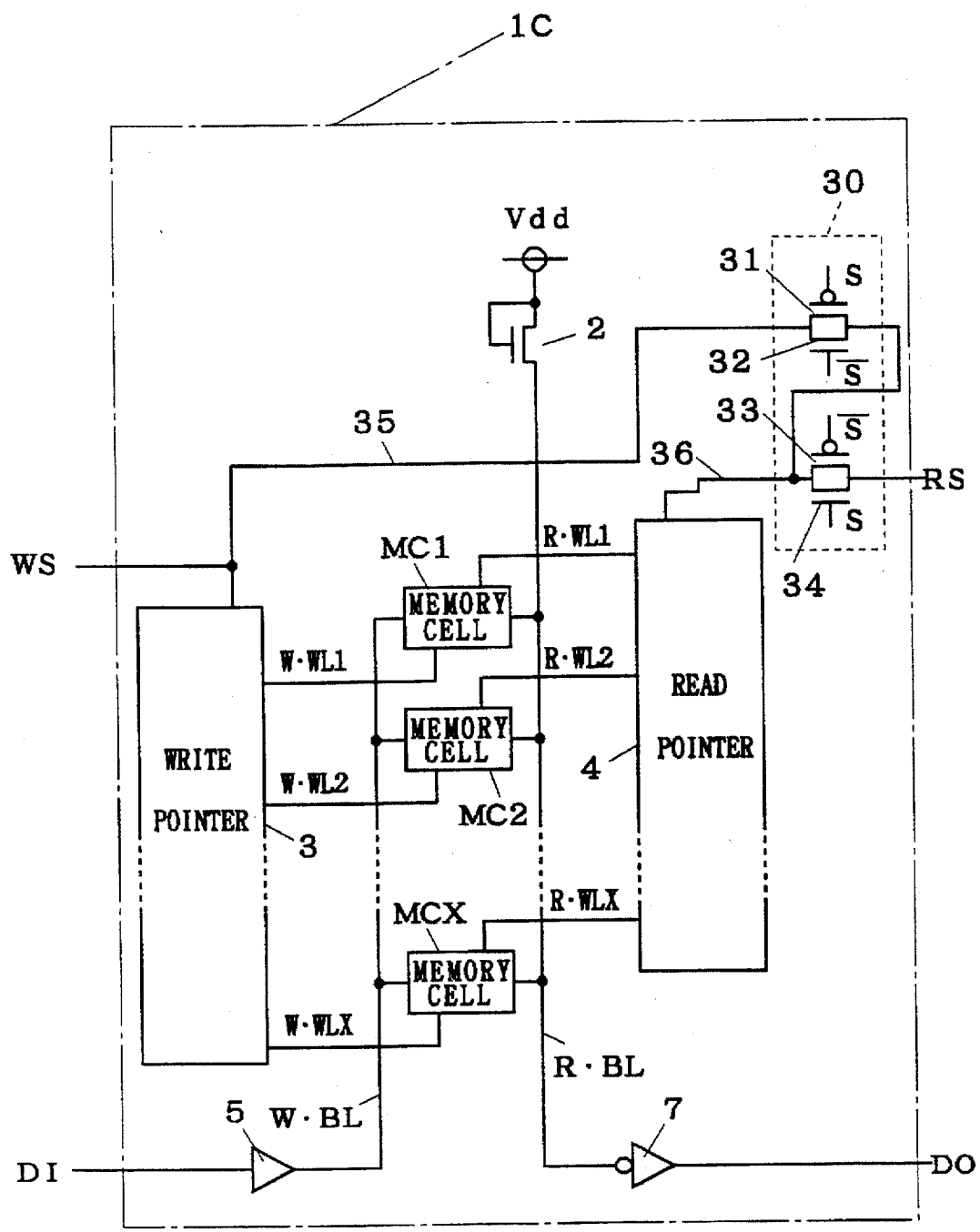
FIG. 10 is a diagram showing an example of a fourth preferred embodiment of the present invention.
Figure 11:
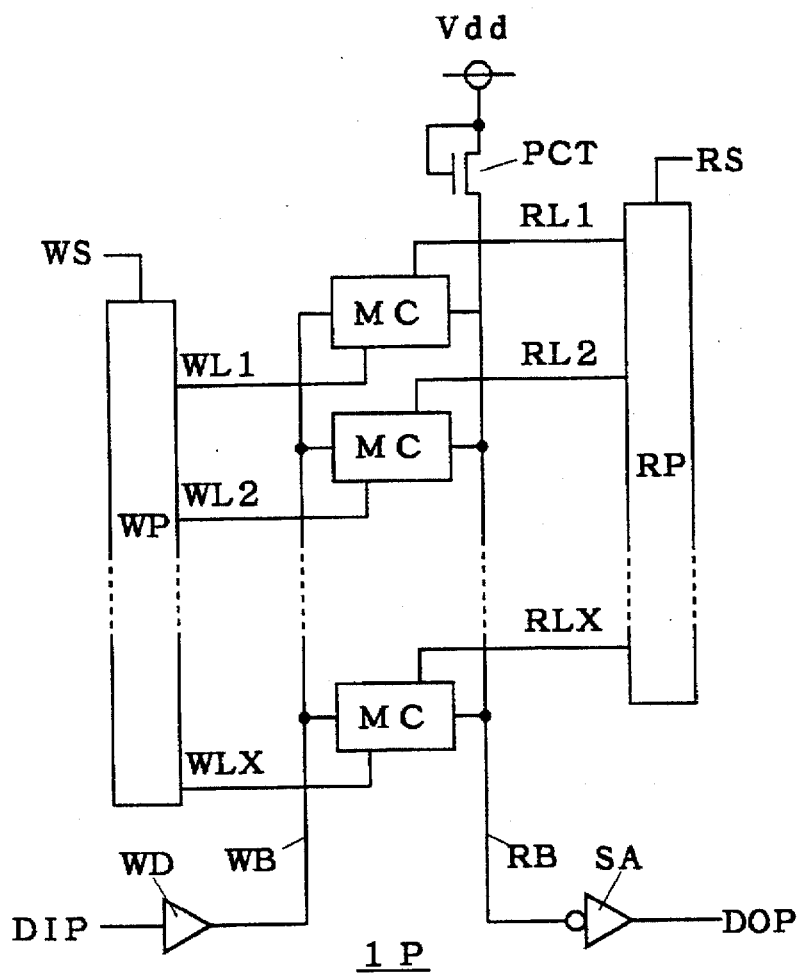
FIG. 11 is a diagram showing a conventional example in a FIFO memory.
Figure 12:
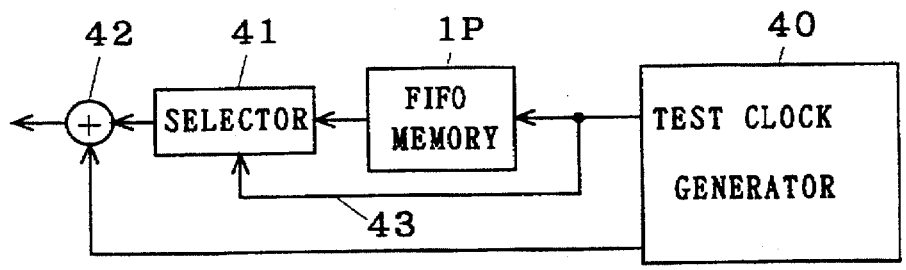
FIG. 12 is a diagram showing a test & evaluation method in the prior art.

FIG. 10 shows an example of application to a FIFO memory 1C in this preferred embodiment.

In FIG. 10, except that a pointer synchronizing selector 30 is provided for selecting a write activate signal WS of the write pointer 3 and a read activate signal RS of the read pointer 4 and for connecting selected one to the read pointer 4, other components are the same as those corresponding in FIG. 1, and operations of the two pointers 3 and 4 and the two sequences of writing and reading are also the same as the operations shown in FIG. 3–FIG. 5.

In this preferred embodiment, by providing the selector 30 which makes the activate input of the write pointer 3 and the activate input of the read pointer 4 common in the test mode, the write word line W.WL and the read word line R.WL are caused to rise at the same time and three transistors in each memory cell (FIG. 2) are all activated to realize a bypass of input data via the memory cell MC. The selector 30 is formed of complementary MOS transistors 31 (p-channel), 32 (n-channel) and complementary MOS transistors 33 (p-channel), 34 (n-channel). A line 35 for transmitting the write activate signal WS is connected to a line 36 for transmitting the read activate signal to the read pointer 4 through the two transistors (31, 32).

When performing the normal memory operation, the first selector control signal S is set to an "H" level and the second selector control signal $\overline{S}$ is set to an "L" level, respectively. At this time, the selector 30 selects the read activate signal RS and inputs it to the read pointer 4.

On the other hand, in the test mode, the first selector control signal S is set to an "L" level and the second selector control signal $\overline{S}$ to an "H" level, respectively. Thus, the selector 30 selects the write activate signal WS, and as a result, activate input of the read pointer 4 is made by the write activate signal WS of the write pointer 3. (Contrarily, it is also possible to control the write activate signal WS by the read activate signal RS side. In this case, one corresponding to the selector 30 is provided on the write pointer 3 side.) This operation causes the write pointer 3 and the read pointer 4 to respectively operate at the same time in synchronization with input of the write activate signal WS, and the write word line W.WL and the read word line R.WL are caused to rise at the same time with respect to one memory cell MC, thereby to realize the bypass of input data.

The selector 30 can have an arbitrary structure, and the selector 30 may be structured by using complementary transistors as in the example of FIG. 10, or it may be formed by using those of the mono-channel type.

Although the memory structure is shown as the FIFO memory 1C in the example of FIG. 10, the present invention can also be applied to the random access memory. In this case, one corresponding to the selector 30 will be provided on the read address decoder side or on the write address decoder side.

Furthermore, although the memory cell has been described as the dynamic type, it can also be applied to the static type.

As has been described hereinabove, each activate signal WS, RS, the word line raising selector 30, the write pointer 3 and the read pointer 4 form the "control means" for causing the write word lines and read word lines of all the memory cells to rise at the same time in the test mode. In the example of FIG. 10, the write pointer 3 corresponds to the "write address generating means" and the read pointer 4 and the word line raising selector 30 correspond to the "read address generating means".

According to the fourth preferred embodiment, in addition to the same effects as those discussed in the third preferred embodiment, another effect further advantageous as compared with those are also obtained. That is to say, since the write activate signal WS and the read activate signal RS undergo selection and one of the activate signals controls the operation of each memory cell, interconnection for that means is provided out of each memory cell MC. Accordingly, as no stray capacitance component is newly loaded on the memory cell MC itself, and then further better electric characteristics can be obtained.

(Summary of Effects of Preferred Embodiments)

Providing a route for bypassing input data in a macro-cell, such as a FIFO memory, RAM, etc. enables monitoring of input data inputted into the memory cell to enhance observability and to reduce the evaluation and test time. Especially in the first and second preferred embodiments, the above effects can be obtained irrespective of good/bad of memory cells.

Also, as the data is bypassed inside the chip, a delay time of data can be minimized as compared with the case in which a test circuit is provided out of the memory, which provides improved area penalty in layout.

While the invention has been described in detail, the foregoing description is in all aspects illustrative and not restrictive. It is understood that numerous modifications and variations can be devised without departing from the scope of the invention.

We claim:

1. A semiconductor storage device, comprising:
   a macro-cell provided inside of a semiconductor integrated circuit;
   said macro-cell comprising:
      an input port;
      a memory cell capable of independently performing writing of data inputted from said input port and reading of said data;
      an output port for outputting said data read from said memory cell in a normal operation; and
      bypass means for connecting said input port to said output port to transmit said data inputted from said input port to said output port without passing through said memory cell and without passing through a storage register in a test mode.

2. The semiconductor storage device according to claim 1, wherein said bypass means shuts off transmission of said data read from said memory cell to said output port and directly connects said input port to said output port in said test mode.

3. The semiconductor storage device according to claim 2, wherein said macro-cell further comprises:
   a driver connected to said input port;
   a write bit line connected to an output end of said driver and an input end of said memory cell;
   a sense amplifier; and
   a read bit line connected to an output end of said memory cell and an input end of said sense amplifier; and
   said bypass means comprises:
      a bypass route having its one end directly connected to said input port; and
      a selector having one and the other of its input ends connected to an output end of said sense amplifier and the other end of said bypass route, respectively, and having its output end connected to said output port, for connecting said output end of said sense amplifier to said output port in said normal operation and connecting the other end of said bypass route to said output port in said test mode.

4. The semiconductor storage device according to claim 2, wherein said bypass means is connected between said input port and said output port.

5. The semiconductor storage device according to claim 1, wherein said macro-cell further comprises:
   a write bit line for transmitting said data inputted from said input port to an input end of said memory cell; and
   a read bit line for transmitting said data read from an output end of said memory cell to said output port, and
   said bypass means directly connects said write bit line and said read bit line in said test mode, and
   said memory cell is controlled not to perform reading of said data in said test mode.

6. The semiconductor storage device according to claim 5, wherein said macro-cell further comprises:
   a driver connected to said input port;
   a sense amplifier;
   a write word line for transmitting a write address signal to said memory cell;
   a read word line for transmitting a read address signal to said memory cell; and
   a precharge transistor having one of its semiconductor regions connected to a power-supply potential,
   said write bit line being connected to an output end of said driver and said input end of said memory cell,
   said read bit line being connected to the other semiconductor region of said precharge transistor, said output end of said memory cell and an input end of said sense amplifier,
   said bypass means comprising:
      a bypass route having its one end and the other end connected to said output end of said driver and said input end of said sense amplifier, respectively,
      said bypass route comprising:
         a selector for connecting said output end of said driver to said input end of said sense amplifier only in said test mode,
         wherein in said test mode said read address signal is supplied as an address signal at a level at which said read word line will not rise and said precharge transistor is controlled to an OFF state.

7. A macro-cell of a semiconductor storage device, comprising:
   input and output ports;
   a memory cell; and
   bypass means for outputting a data inputted from said input port directly from said output port without by way of said memory cell and without passing through a storage register in a test mode.

8. The macro-cell of a semiconductor storage device according to claim 7, wherein said bypass means connects a bypass route connected to said input port to said output port in said test mode and connects a read bit line of said memory cell to said output port when it is not in said test mode.

9. The semiconductor storage device according to claim 7, wherein said bypass means is means for connecting a write bit line of said memory cell connected to said input port and a read bit line of said memory cell connected to said output port in said test mode, and
   said memory cell is controlled not to perform reading operation in said test mode.

10. A semiconductor storage device comprising:
    a macro-cell provided inside of a semiconductor integrated circuit, wherein said macro-cell comprises:
an input port;
a plurality of memory cells which are capable of independently performing writing of a data inputted from said input port and reading of said data; and
an output port for outputting said data read from each of said plurality of memory cells,
wherein in a test mode an arbitrary one of said plurality of memory cells is controlled to be able to simultaneously perform writing and reading of said data and others are all controlled not to be able to read said data.

11. The semiconductor storage device according to claim 10, wherein each of said plurality of memory cells comprises:
a write word line for inputting a write address signal; and
a read word line for inputting a read address signal,
wherein, in said test mode,
a signal at a level capable of raising is simultaneously applied to said write word line and said read word line of said arbitrary one memory cell, and said read address signal at a level incapable of raising is supplied to said read word lines of said other memory cells.

12. The semiconductor storage device according to claim 11, wherein said write word line of said arbitrary one memory cell comprises:
a write word line raising selector for stopping supply of said write address signal and applying said signal at the level capable of raising to the write word line in said test mode, and supplying said write address signal to the memory cell when it is not in said test mode, and
said read word line of said arbitrary one memory cell comprises:
a read word line raising selector for stopping supply of said read address signal and applying said signal at the level capable of raising to the read word line in said test mode, and supplying said read address signal to the memory cell when it is not in said test mode.

13. A macro-cell of a semiconductor storage device, comprising:
a plurality of memory cells; and
means for causing a write word line and a read word line only of an arbitrary memory cell in said plurality of memory cells to simultaneously rise in a test mode.

14. A macro-cell of a semiconductor storage device, comprising:
a plurality of memory cells; and
means for causing write word lines and read word lines of all of said plurality of memory cells to simultaneously rise in a test mode.

15. A semiconductor storage device comprising:
a macro-cell provided inside of a semiconductor integrated circuit,
said macro-cell comprising:
an input port;
a plurality of memory cells having write word lines and read word lines and capable of independently writing a data inputted from said input port and reading said data;
an output port for outputting said data read from each of said plurality of memory cells; and
control means for causing the write word lines and the read word lines of all of said plurality of memory cells to rise simultaneously in a test mode.

16. The semiconductor storage device according to claim 15, wherein said control means comprises:
write address signal generating means for receiving a write activate signal to supply said write word line of each of said plurality of memory cells with a corresponding write address signal at a level capable of raising in said test mode; and
read address signal generating means for supplying said read word line of each of said plurality of memory cells with a corresponding read address signal at a level capable of raising in synchronization with said write activate signal in said test mode.

17. The semiconductor storage device according to claim 16, wherein said read address signal generating means comprises a selector for selecting and inputting said write activate signal in said test mode and for selecting and inputting a read activate signal when it is not in said test mode.

* * * * *